(12) United States Patent
Kang et al.

(10) Patent No.: US 6,246,581 B1
(45) Date of Patent: Jun. 12, 2001

(54) HEATED PCB INTERCONNECT FOR COOLED IC CHIP MODULES

(75) Inventors: Sukhvinder Kang, Rochester, MN (US); Howard Victor Mahaney, Jr., Cedar Park, TX (US); Roger R. Schmidt; Prabjit Singh, both of Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/415,740

(22) Filed: Oct. 12, 1999

(51) Int. Cl.[7] .................................................. H05K 7/20
(52) U.S. Cl. .......................... 361/700; 361/702; 361/699; 361/704; 361/719; 257/713; 257/715; 165/104.33; 165/104.21
(58) Field of Search ..................... 361/700–710, 361/719, 689, 699, 702, 701, 704, 705, 683; 165/80.4, 104.21, 104.22, 104.24, 104.33; 257/713–715; 174/16.1, 15.1, 16.3; 219/200, 201, 209, 210; 62/252.2, 150, 51.1, 51.2

(56) References Cited

U.S. PATENT DOCUMENTS

| 3,289,046 | * | 11/1966 | Carr ........................................ 317/101 |
| 3,440,407 | * | 4/1969 | Goltsos et al. ......................... 219/494 |
| 4,279,292 | * | 7/1981 | Swiatosz ................................. 165/61 |
| 4,950,181 | * | 8/1990 | Porter ..................................... 439/485 |
| 5,010,233 | * | 4/1991 | Henschen et al. ..................... 219/209 |
| 5,028,988 | | 7/1991 | Porter et al. ............................ 357/81 |
| 5,142,443 | | 8/1992 | Moore, Jr. .............................. 361/385 |
| 5,268,812 | | 12/1993 | Conte ..................................... 361/698 |
| 5,331,273 | * | 7/1994 | Schneider ........................... 324/158.1 |
| 5,349,823 | | 9/1994 | Solomon ..................................... 62/6 |
| 5,365,749 | | 11/1994 | Porter ................................... 62/259.2 |
| 5,463,872 | | 11/1995 | Vader et al. ............................ 62/51.1 |
| 5,504,924 | | 4/1996 | Ohashi et al. .......................... 375/800 |
| 5,539,186 | * | 7/1996 | Abrami et al. ......................... 219/548 |
| 5,574,627 | * | 11/1996 | Porter ................................... 361/719 |
| 5,896,259 | * | 4/1999 | Farwee et al. ........................... 361/78 |
| 5,938,956 | * | 8/1999 | Hembree et al. ...................... 219/209 |
| 6,054,676 | * | 4/2000 | Wall et al. ............................. 219/209 |

FOREIGN PATENT DOCUMENTS

| 0444570A2 | * | 4/1991 | (EP) ................................. G06F/1/20 |
| 401236699A | * | 9/1989 | (JP) ................................. H05K/7/20 |

* cited by examiner

Primary Examiner—Leo P. Picard
Assistant Examiner—Michael Datskovsky
(74) Attorney, Agent, or Firm—Floyd A. Gonzalez; Cantor Colburn LLP

(57) ABSTRACT

A cooling assembly for an integrated circuit chip module wherein an evaporator-cooled IC module is enclosed within an insulated housing and attached to a printed circuit board through an interconnect including a heating element embedded therein.

8 Claims, 3 Drawing Sheets

HEATED PCB INTERCONNECT FOR COOLED IC CHIP MODULES

BACKGROUND OF THE INVENTION

The present invention relates to a cooling assembly for lowering the temperature of integrated circuit (IC) chip modules mounted on a printed circuit board (PCB) substrate, and, more particularly, to a heated interconnect between the cooled IC chip module and the PCB to prevent condensation.

The high circuit densities and operating frequencies in modern integrated circuit devices and multi-chip modules of today's computer systems has resulted in a significant increase in the power dissipated by such chip and module components. No matter how fast one wishes to operate a given electronic circuit chip, there almost always is the potential for running it faster if the chip were to be cooled further and more thermal energy were removed during its operation. This is true of computer processor circuit chips and more particularly of such chips disposed within multi-chip modules that generate significant amounts of heat. Because of the demand to run processor modules at increasingly higher speeds, the clock frequencies at which the devices must operate also increases. Power generation correspondingly rises in proportion to the clock frequency, generating thermal demands in terms of energy which must be removed for faster, safer, and more reliable circuit operation. It is required that cooling arrangements be provided so that the heat generated by the operation of these components be effectively and efficiently removed in order to maintain the temperature of the devices within the limits that will keep the operating parameters of the devices in a predetermined range, and, further, to prevent the damage or destruction of the integrated circuit devices by overheating from the high temperatures generated.

Using refrigeration technology, integrated circuit chips and multi-chip modules readily can be cooled to appropriately low temperatures. In addition, however, to the necessity of cooling to prevent damage from overheating, it is also recognized that cooling offers marked advantages in circuit speed, system throughput, and component reliability. With the advent of CMOS processors for computers, the potential performance improvements obtained by lowering chip temperature are intriguing. It is known that a CMOS circuit is capable of operating at higher clock speeds as the circuit temperature is lowered. Current CMOS chip circuit designs generally perform about two percent faster for each 10° C. the chip temperature is lowered. Accordingly, it would not be unreasonable to achieve a 100° C. reduction in chip temperature with refrigeration techniques as compared to cooling with ambient air, thus achieving a 20% performance improvement. It has been reported that the processor frequency of a CMOS processor has been improved by nearly threefold by cooling the processor to temperatures around −200° C.

Various techniques for the cooling of integrated circuit electronic devices are known and many have been implemented with success. Some practiced techniques involve conventional methods such as by directing ambient air onto the components to be cooled, by sealing the computer cabinet and refrigerating the interior of the cabinet; as well as by immersing components in coolants such as liquid nitrogen. Individual integrated chip or multi-chip module components also have been cooled through specialized devices such as hollow cold plates which are attached to the components to be cooled. Liquid coolants can be circulated through the hollow cold plates to effect cooling of the attached components.

However, in order to take practical advantage of the performance improvements achievable by lowering integrated chip temperatures to levels, for example, in the range of −40° C. to −60° C., many engineering problems must be addressed. In addition to issues involving refrigeration system design, evaporator design, and thermal controls, cooling of the electronic components to a temperature below the ambient environment dew point results in condensation problems in that moisture will condense on the cooled components and on the structures and components to which the cooled components may be attached. This condensation can damage and literally destroy the electronic circuitry associated with the integrated chip or multi-chip module and the circuit board on which it is mounted.

Accordingly, an arrangement is needed for an integrated chip or multi-chip module device which effectively and efficiently can prevent condensation damage to the device or contiguous components or circuitry when the temperature of the device is reduced to below ambient dew point.

SUMMARY OF THE INVENTION

Now, an improved interconnect for an integrated circuit (IC) device mounted on a printed circuit board (PCB) within a computer system has been developed whereby the IC device is effectively cooled while damaging condensation is controlled from forming on the PCB on which the IC device is mounted, as well as other electrical components contiguous to the cooled device. According to the present invention, a cooling assembly is provided which comprises an evaporator unit attached to the top of the hat, or cover, of an integrated chip module and in thermal communication with the hat surface. In order to maintain the reduced temperature of the cooled device and isolate the device from the ambient warm environment, the IC module and attached cooling evaporator unit are housed within an insulated enclosure which fully envelops the device and evaporator and is itself bonded around its bottom peripheral edge to the surface of the printed circuit board around the outer perimeter of the module to board interface. The enclosure includes walls fabricated from thermal insulating material. Such material comprises rigid structural foam such as polyurethane foam, and the like, in order to provide structural integrity as well as a thermal insulative barrier. Typically, such structural foams feature thermal conductivities ranging from about 0.04 to about 0.12 W/m.° K. The preferred insulating material is rigid polyurethane foam. While it is critical to cool the IC module to low temperatures, typically in the range of about −40° C. to about −60° C., cooling to such temperatures below ambient dew point presents potential condensation problems on the cooled component as well as structures and other components attached to and around the cooled component. The described insulation helps to isolate the cooled module from the surrounding environment, but, at the low temperatures to which the module is cooled, the module and the insulated enclosure itself may conduct enough cold to the PCB on which they are mounted to result in condensation on the PCB and adjacent components. Accordingly, in order to prevent condensation at the interface of the cooled module assembly and the printed circuit board, an electrical interconnect member is provided between the module and the PCB which effectively raises the temperature of the interface. The interconnect serves to couple the module to the printed circuit board and can be any suitable sheet material with means to provide electrical connection between the contacts on the base of the module to those on the PCB. Such materials include polycarbonate polymer material available from the General Electric Company under the trademark of Lexan, or polyurethane, and the like. The interconnect may have a thickness from about 0.02 mm to about 1 mm, and may be used in single or multiple layers. Preferably, in order to provide electrical connection between the module and the PCB, the interconnect material includes a pattern of electrical pads, made from copper composites, platinum wire, gold wire, and the like, matching the desired pattern of contacts between the module and PCB. Because the electrical interconnect between the module and PCB also provides a good thermal path between the PCB and module, cooling of the module results in low temperatures on the PCB to which it is connected, causing condensation to form at the module-to-PCB interface, as well as adjacent areas of the PCB and adjacent components attached to the PCB. According to the present invention, an electrical heater line is embedded within the interconnect material. By applying low voltage power to this heater line, sufficient heat can be generated so as to offset the low temperature conducted from the cooled module. In this manner, the temperature at the printed circuit board can be maintained above the ambient dew point and condensation prevented from forming. To provide redundancy in heater design, two separate electrical heater lines can be routed within the same interconnect layer, or, separate interconnect layers with their own heater lines may be utilized.

The above-discussed and other features and advantages of the present invention will be appreciated and understood by those skilled in the art from the following detailed description and drawings.

BRIEF DESCRIPTION OF THE DRAWINGS

Referring now to the drawings in which like elements are numbered above in the several Figures.

DETAILED DESCRIPTION OF THE INVENTION

Figure 1:
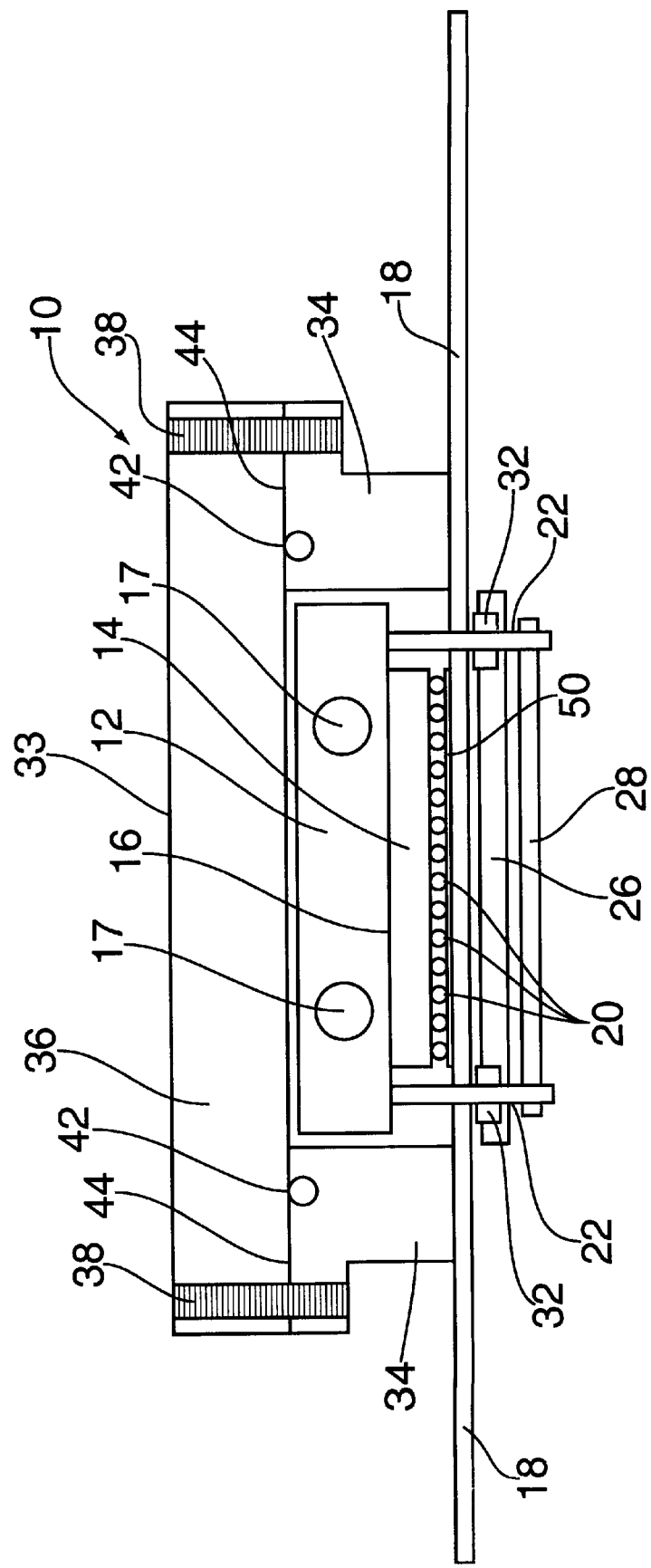
FIG. 1 is a cross-sectional side view of an evaporator-cooled integrated circuit chip module mounted on a printed circuit board through a heated interconnect pursuant to the present invention.

Referring to FIG. 1, a cooling assembly 10 is shown comprising an evaporator unit 12, which is a thermal block of aluminum or copper, mounted on top of the hat, or cover, of an integrated circuit chip module 14, forming a thermal interface through conductive grease layer 16. In operation, coolant fluid from a refrigeration unit (not shown) is circulated through serpentine passages 17, bored or drilled into evaporator block 12, in a predetermined pattern. IC module 14 is in electrical communication with printed circuit board 18 via solder ball connections 20. The evaporator unit 12 is attached to the printed circuit board 18 by bolts 22, around its periphery, which extend from evaporator 12 and pass through printed circuit board 18 and are threaded into stiffener member 26, which serves to reinforce and stiffen the printed circuit board to prevent it from flexing under the stress of the mounted cooling assembly 10, and finally threaded into steel spring plate 28. Rubber O-rings 32 seal around the mounting bolts and help to prevent air leakage into the assembly. In order to insulate the IC module 14 from the warm ambient surroundings, the evaporator-cooled module 14 is fully enclosed within an insulated housing 33 comprising a base member 34 and lid 36. Base 34 is made of a rigid polyurethane foam material, which preferably is formed by being molded to the appropriate shape. The bottom of enclosure base member 34 is bonded to the surface of the printed circuit board 18 through a suitable adhesive (not shown). The lid 36, which is separate and removable from base 34 in order to provide service access to IC module 14, also is made from a rigid polyurethane foam and is attached to the base by threaded connectors 38. To ensure an airtight seal between the lid 36 and base 34, an O-ring 42 is set around the interface of the lid 36 and base 34, along with a layer of grease 44.

Cooling of the IC module to typical temperatures in the range of –40 to –60° C. readily could introduce condensation problems on the outer surface of the insulated housing, as well as other structures and electrical components which are nearby or to which the IC module is attached. Accordingly, it is desirable to maintain the inside of the enclosure as cold as possible, while the outside of the enclosure is maintained warm, above ambient environment dew point. The lid 36 and base 34 of the housing enclosure are made of insulating material, such as a rigid polyurethane foam, in order to insulate the cold enclosure from the warm outer surface of the housing. However, cold also is conducted to the surface of printed circuit board 18 from cooled module 14, resulting in a potential condensation problem on printed circuit board 18 as well as on adjacent components (not shown) to module 14 mounted on printed circuit board 18, as cold temperatures are conducted laterally through the adjacent PCB area. To prevent condensation, module 14 is attached to printed circuit board 18 via solder ball connections 20 through heated interconnect layer 50.

Figure 2:
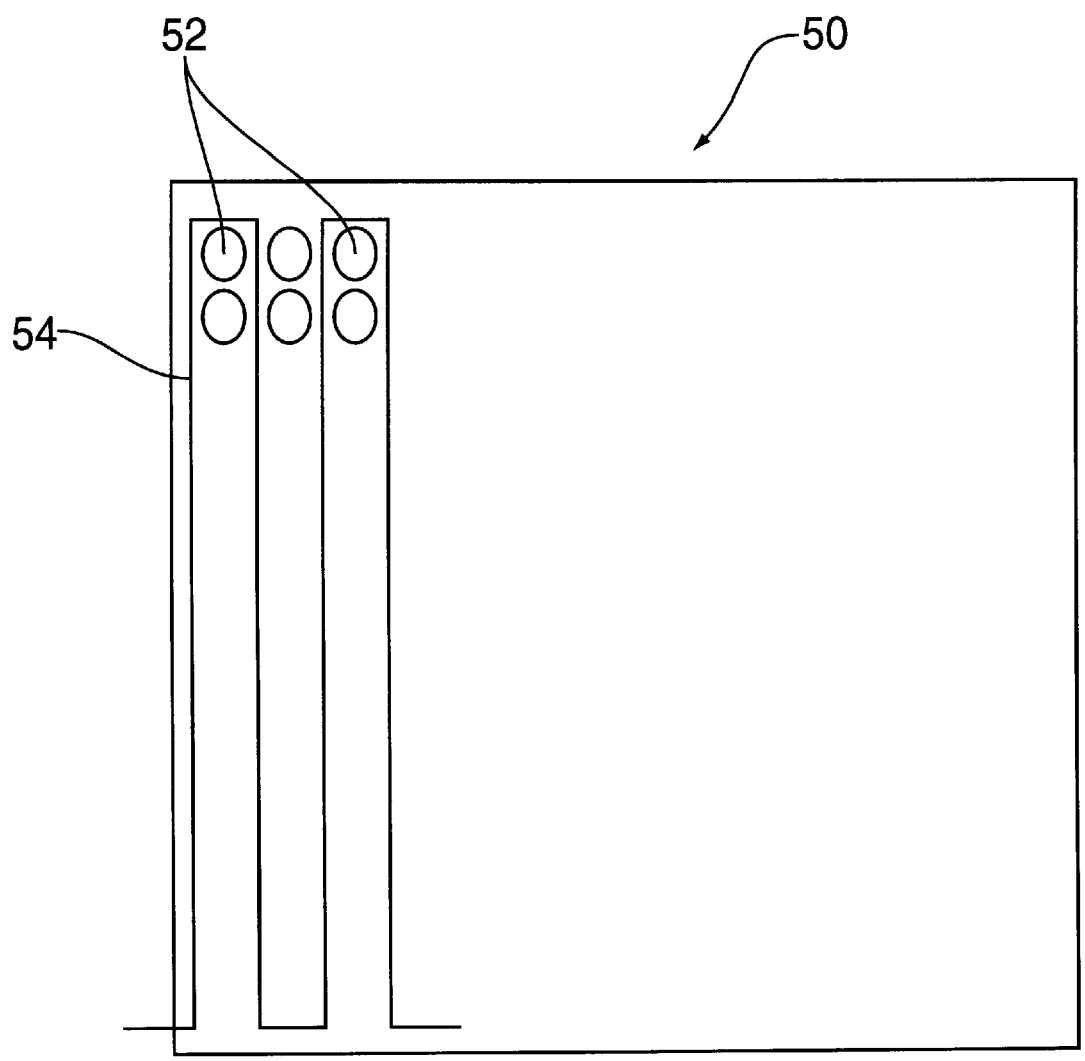
FIG. 2 is a top view of an interconnect layer pursuant to the present invention.

As illustrated in FIG. 2, interconnect 50 consists of a sheet of Lexan material, polyurethane, or the like and includes a pattern of electrical pads 52 arranged over the area of the interconnect 50 corresponding with the solder ball connections 20 on the base of module 14 so as to facilitate electrical connection of module 14 to contacts on printed circuit board 18. Embedded in the interconnect layer 50 and interweaved between the electrical pads 52 is a heater line 54. Heater line 54 is a line of copper material. To effect heating to guard against condensation, a low voltage is applied to the heater line 54.

Figure 3:
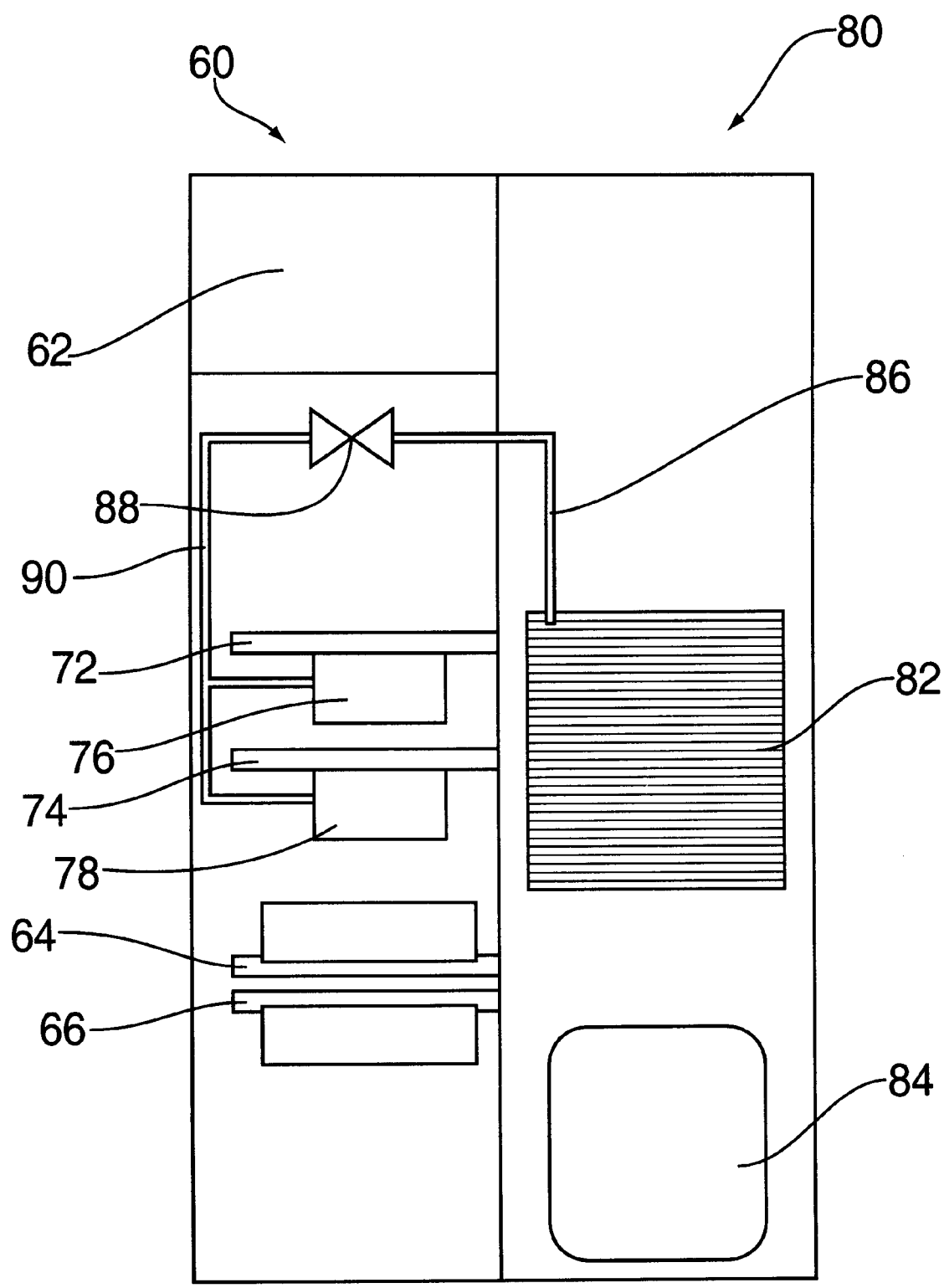
FIG. 3 is a simplified front view depicting the arrangement of components in a typical workstation processor unit in which the present invention may be incorporated.

FIG. 3 is a simplified front view showing the arrangement of components in a typical computer workstation processor unit 60 wherein one or more integrated circuit chip modules is cooled through a refrigerated evaporator unit. The processor unit 60 consists of a power supply 62, memory cards 64 and 66, to which component modules 68 and 70 are mounted, and processor PCB cards 72 and 74, to which evaporator cooled processor integrated chip modules enclosed within insulated housings 76 and 78 are mounted. Mated next to the processor unit 60 is sidecar refrigeration unit 80 which provides cooling for processor unit 60. Refrigeration unit 80 consists of condenser 82 and compressor 84, interconnected with appropriate hosing and conduits (not shown) and connected through flexible refrigerant line 86 with quick connect coupling 88 to refrigerant distribution hose 90. Distribution hose 90 conducts coolant to the evaporator blocks within insulated housings 76 and 78 to cool the enclosed IC modules.

While the invention has been described with reference to specific embodiments thereof, it is intended that all matter contained in the above description and shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention as defined in the amended claims.

We claim:

1. A cooling assembly for an integrated circuit chip module mounted on a printed circuit board substrate comprising:

an evaporator unit having a thermal interface in thermal communication with said integrated circuit chip module so as to cool said module to a temperature below ambient dew point;

an insulated housing having its base attached to said printed circuit board substrates said base surrounding the outer perimeter of said integrated circuit module so as to enclose said evaporator unit and said integrated circuit module; and an interconnect layer interposed between and electrically coupling the integrated circuit chip module and the printed circuit board substrate through a pattern of contact connections on the chip module and electrically conducting pads on said interconnect layer, said interconnect layer including a heating element embedded therein between said module and said substrate.

2. The cooling assembly of claim 1 wherein said interconnect layer includes electrically conductive material selected from the group consisting of copper composites, platinum, and gold.

3. The cooling assembly of claim 2 wherein said interconnect layer is a sheet of polycarbonate polymer or polyurethane, having a thickness of about 0.2 mm to about 1 mm.

4. The cooling assembly of claim 1 wherein said interconnect layer includes a heating element which is a line of electrically conductive material.

5. The cooling assembly of claim 4 wherein the line of electrically conductive material is a line of copper.

6. The cooling assembly of claim 1 wherein the interconnect layer includes a pattern of electrical pads to facilitate electrical connection between the integrated circuit chip module and the printed circuit board substrate.

7. The cooling assembly of claim 1 wherein said interconnect layer includes multiple independent heating elements.

8. The cooling assembly of claim 1 wherein multiple interconnect layers are interposed between the integrated circuit chip module and the printed circuit board substrate.

* * * * *

UNITED STATES PATENT AND TRADEMARK OFFICE
CERTIFICATE OF CORRECTION

PATENT NO.    : 6,246,581 B1
DATED         : June 12, 2001
INVENTOR(S)   : Kang et al.

It is certified that error appears in the above-identified patent and that said Letters Patent is hereby corrected as shown below:

<u>Column 5,</u>
Line 16, after "board" delete "substrates" and insert therefor -- substrate, --

Signed and Sealed this

Fourth Day of January, 2005

JON W. DUDAS
*Director of the United States Patent and Trademark Office*